(12) United States Patent
Galand et al.

(10) Patent No.: US 10,559,777 B2
(45) Date of Patent: Feb. 11, 2020

(54) RADIATION CURABLE COMPOSITION FOR WATER SCAVENGING LAYER, AND METHOD OF MANUFACTURING THE SAME

(71) Applicant: BASF COATINGS GMBH, Münster (DE)

(72) Inventors: Emilie Galand, Blotzheim (FR); Zakaria Belbakra, Colmar (FR); Zoubair Cherkaoui, Hégenheim (CH); Richard Frantz, Village-Neuf (FR)

(73) Assignee: BASF Coatings GmbH, Münster (DE)

( * ) Notice: Subject to any disclaimer, the term of this patent is extended or adjusted under 35 U.S.C. 154(b) by 5 days.

(21) Appl. No.: 14/415,475

(22) PCT Filed: Jul. 16, 2013

(86) PCT No.: PCT/EP2013/065012
§ 371 (c)(1),
(2) Date: Jan. 16, 2015

(87) PCT Pub. No.: WO2014/012931
PCT Pub. Date: Jan. 23, 2014

(65) Prior Publication Data
US 2015/0179976 A1    Jun. 25, 2015

(30) Foreign Application Priority Data

Jul. 19, 2012 (EP) .................................. 12177006

(51) Int. Cl.
*H01L 51/52* (2006.01)
*C08K 3/22* (2006.01)
(Continued)

(52) U.S. Cl.
CPC .......... *H01L 51/5253* (2013.01); *C09D 11/30* (2013.01); *H01L 51/0043* (2013.01); *H01L 51/56* (2013.01)

(58) Field of Classification Search
CPC . H01L 51/5253; H01L 51/0043; H01L 51/56; C09D 11/30; C09D 11/31; C08K 3/22
See application file for complete search history.

(56) References Cited

U.S. PATENT DOCUMENTS 6,469,111 B1 * 10/2002 Mihan ..................... C08F 10/02
526/74
2004/0195967 A1    10/2004 Padiyath et al.
(Continued)

FOREIGN PATENT DOCUMENTS

CN    101423675 A    5/2009
CN    101518151 A    8/2009
(Continued)

OTHER PUBLICATIONS

CN101423675 machine English translation (Huang et al.), pub May 2009.*
(Continued)

*Primary Examiner* — Jessica M Roswell
(74) *Attorney, Agent, or Firm* — Armstong Teasdale LLP

(57) ABSTRACT

A radiation curable resin composition comprising:
(A) metal oxide particles;
(B) at least one photoinitiator, preferably a radical photoinitiator, or any mixture thereof;
(C) at least one acrylate or methacrylate component with a ClogP higher than 2, preferably higher than 4, more preferably higher than 5, or any mixture thereof;
(D) at least one monofunctional acrylate or methacrylate diluent component, preferably with a viscosity below 40 mPa·s at 20° C., or any mixture thereof;
(E) at least one acrylate or methacrylate component with functionality equal or higher than 3, preferably 3 or 4, or any mixture thereof;

(Continued)

can be advantageously used, for example, in multilayer barrier stacks for the production of organic opto-electric or opto-electronic device, such as Organic Light Emitting Diode (OLED).

17 Claims, 1 Drawing Sheet

(51) Int. Cl.
*C09D 11/30* (2014.01)
*H01L 51/00* (2006.01)
*H01L 51/56* (2006.01)

(56) References Cited

U.S. PATENT DOCUMENTS

| | | | |
|---|---|---|---|
| 2004/0252373 A1* | 12/2004 | Umeya | G02B 5/3016 |
| | | | 359/449 |
| 2005/0068406 A1* | 3/2005 | Koyama | B41J 2/33545 |
| | | | 347/203 |
| 2005/0146544 A1 | 7/2005 | Kondo | |
| 2005/0227114 A1 | 10/2005 | Tanaka et al. | |
| 2006/0134400 A1* | 6/2006 | Takada | C08G 18/672 |
| | | | 428/313.9 |
| 2009/0289549 A1 | 11/2009 | Lee et al. | |
| 2010/0089636 A1 | 4/2010 | Ramadas et al. | |
| 2011/0188261 A1* | 8/2011 | Deng | B29D 11/00663 |
| | | | 362/551 |
| 2014/0027739 A1 | 1/2014 | Van De Weijer et al. | |

FOREIGN PATENT DOCUMENTS

| | | |
|---|---|---|
| EP | 2 445 029 A1 | 4/2012 |
| JP | 2010126675 A | 6/2010 |
| WO | 02/46323 A2 | 6/2002 |
| WO | 2014/012931 A1 | 1/2014 |

OTHER PUBLICATIONS

Huang et al., Machine English translation of CN 101423675, published May 6, 2009.*
"Dynamic light scattering", http://en.wikipedia.org/wiki/Dynamic_light_scattering (Retrieved Oct. 27, 2014).
G.L. Graff, et al., "Mechanisms of vapor permeation through multilayer barrier films: Lag time versus equilibrium permeation", Journal of Applied Physics, Aug. 15, 2004, pp. 1840-1849, vol. 96, No. 4.
"Osiris Property Explorer" http://www.organicchemistry.org/prog/peo (Retrieved Oct. 27, 2014).
"Partition coefficient", http://en.wikipedia.org/wiki/Partition_coefficient (Retrieved Oct. 27, 2014).
"Thermogravimetric analysis", http://en.wikipedia.org/wiki/Thermogravimetric_analysis (Retrieved Oct. 27, 2014).
"Viscometer", http://en.wikipedia.org/wiki/Viscometer (Retrieved Oct. 27, 2014).
International Search Report of PCT/EP2013/065012, dated Oct. 2, 2013. [PCT/ISA/210].
Database WPI, Week 200941, Thomson Scientific, London, GB; AN 2009-J14796 (2009), 3 pages, for CN 101 423 675 A (Univ Sichuan) May 6, 2009.

* cited by examiner

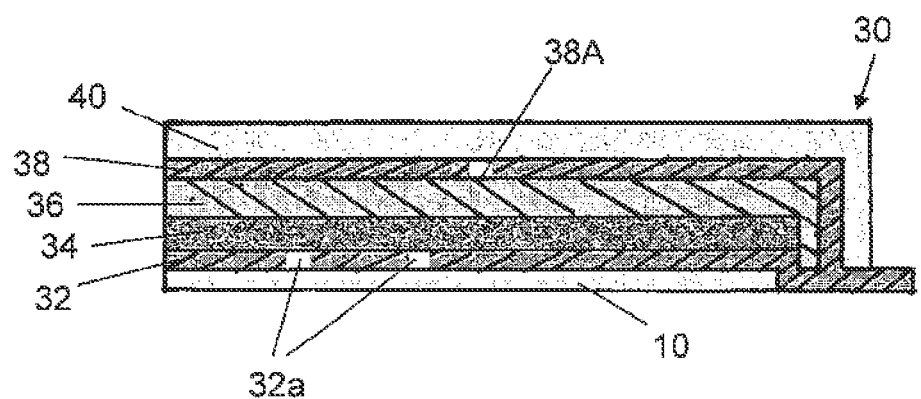

RADIATION CURABLE COMPOSITION FOR WATER SCAVENGING LAYER, AND METHOD OF MANUFACTURING THE SAME

CROSS REFERENCE TO RELATED APPLICATIONS

This application is a National Stage of International Application No. PCT/EP2013/065012 filed Jul. 16, 2013, claiming priority based on European Patent Application No. 12177006.9, filed Jul. 19, 2012, the contents of all of which are incorporated herein by reference in their entirety.

BACKGROUND OF THE INVENTION

Field of the Invention

The present invention relates to a radiation curable or photocurable composition for water scavenging layer, to be advantageously used, for example, in a multilayer barrier stack, which may be employed, for instance, in the manufacturing of an organic opto-electric or opto-electronic device such as Organic Light Emitting Diode (OLED).

The present invention further relates to a method of manufacturing the radiation curable composition or photocurable composition, the water scavenging layer, the multilayer barrier stack and the organic opto-electric device or OLED itself.

Related Art

Exposure of moisture sensitive devices such as organic LEDs (both small molecule and polymer based), OPV, CI(G)S solar cells, to the ambient atmosphere results in loss of performance of the device. In the case of OLEDs, ingress of water or of other oxidizing materials can lead to degradation of the active organic layers leading to loss of efficiency mainly due to oxidation of the cathode, leading to local failure of the device. Water ingress can come from two sides, from the anode side or the cathode side. Current state-of-the-art OLEDs are protected from water ingress by using glass as a substrate and glass or metal lids to encapsulate on the cathode side. Conventionally, encapsulation is performed with a coverlid glued at the edges. A getter is used to consume water that might penetrate through the glue. This encapsulation method is expensive and is not functional for large-area devices, especially flexible ones. A more costeffective alternative, which also will allow flexible devices to be manufactured, is the use of thin film barriers, which can be applied on a plastic foil to act as a substrate and which can be used as a final encapsulation. In order to understand the issues with such kind of barrier, a brief explanation is given below about the mechanism of water ingress in an OLED.

The cathode in an OLED device most often consists of a thin (1-50 nm) layer of Ba (polymer LED) or LiF (small molecule OLED) covered with a relatively thick Al layer. Aluminum would be an excellent barrier against water, if not for the fact that it contains pinholes, of which most of them are caused by particles. Such particles originate from a plurality of causes and their presence is in practice difficult to avoid. Water from the ambient atmosphere is penetrating through pinholes in the cathode layer. Oxidation of metal at the cathode-polymer interface prevents electron injection from the cathode into the polymer during operation of the device, thus introducing a local spot without emission, i.e. a black spot in the bright electroluminescent background. The evolution of the black spots is determined by the diffusion rate of water from the pinhole. The area of the resulting circular shaped spots increases linearly with time. Black spot formation and growth is a shelf effect, i.e. no current or voltage is necessary to drive the process. When an inorganic barrier layer is applied on top of the OLED, the majority of the particles is covered, resulting in a corresponding decrease in the number of black spots. Still the remaining black spot density is by far too large for any practical application. Increase of the thickness of the barrier layer hardly reduces the pinhole density. Once a pinhole is present in such a layer, it tends to propagate while depositing more of the same material.

Graff et al. describe in "Mechanisms of vapor permeation through multilayer barrier films: Lag time versus equilibrium permeation", J. of Applied Physics, Vol. 96, Nr. 4, pp. 1840-1849 a nowadays common strategy to interrupt the growth of pinholes by a barrier stack with organic layers. In this way, the pinholes in subsequent barrier layers are decoupled resulting in a tortuous path for water transport from the ambient atmosphere to the cathode in the device. Also other layers of different chemical composition, such as different inorganic materials are used for this purpose. Graff et al. investigated the use of polymer decoupling layers having a thickness in the range of 0.1 to 3 μm and suggested that even thinner polymer decoupling layers could result in further improvement.

US2009289549A describes an OLED display provided with a multi-layered protective barrier stack, wherein organic and inorganic layers are alternately stacked in a repeated manner and at least one moisture absorbing layer or water scavenging layer is interposed in the multi-layered protective layer. In particular, US2009289549A describes an embodiment wherein the multilayered protective layer comprises a first inorganic layer, a moisture absorbing layer (water scavenging layer), an organic layer and a second inorganic layer in this order. The presence of the moisture absorbing layer further reduces the ingress of water towards the opto-electric element. The moisture absorbing layer is formed of an organic metal compound solution and may contain additives such as a metal or a metal oxide. The moisture absorbing layer may have a thickness in the range of 3 to 50 nm. It is remarked in US2009289549A that the organic layer between the moisture absorbing layer and the second inorganic layer may have a thickness larger than the thickness of the moisture absorbing layer. The cited US patent does not disclose more specifically how much larger the thickness should be, but the drawing that is referred to suggests that the second organic layer is about two to three times thicker.

The deposition and manufacturing of a suitable moisture absorbing layer or water scavenging layer for opto-electrical devices has revealed exceptional technical difficulties from the point of view of the chemistry and of the required physical properties. No suitable materials have been found up to now, which fulfill all physical, mechanical, optical and processing requirements demanded by the industrial manufacturing of opto-electrical devices and OLED.

Calcium oxide is for example highly hygroscopic, and is useful as a moisture absorbent and a dehydrating agent, in particular in electronic enclosures where moisture decreases the device lifetime. From a viewpoint of handling in optoelectrical applications it would be however necessary to provide calcium oxide in the form of a homogeneous stable liquid, which could be coated or printed and cured on different substrates and at different thicknesses. From a viewpoint of processing in certain opto-electric applications, in particular for making individual layouts and for on demand printing, it would be necessary to be able to deposit the hygroscopic material as a curable ink via inkjet printing, valve jet printing, and liquid dispensing methods. For patterning via gravure printing the viscosity of the ink must be lower than 200 mPa·s at 20° C., and for flexo printing the viscosity of the ink must be lower than 500 mPa·s at 20° C. These are among favoured roll to roll printing techniques. It can be also necessary to have access to medium and low viscosity resins exhibiting the water scavenging properties.

SUMMARY OF THE INVENTION

It is an object of the present invention to provide a photocurable composition containing oxide particles for making water scavenging layers, which is stable and flowable, so that it can be easily dispensed or printed for example via inkjet/valve jet printing or via gravure and flexoprinting.

It is a further object of the present invention to provide a method of manufacturing such a photocurable composition, which is simple, fast and economically viable.

It is a further object of the present invention to provide a method of manufacturing a water scavenging layer, which is simple, fast, economically viable and suited for opto-electric devices and applications.

It is a further object of the present invention to provide a method for manufacturing a light-emitting device or opto-electric devices, in particular an organic light emitting diode (OLED), which is simple, fast, economically viable, whereby the light-emitting device, in particular the organic light emitting diode (OLED), remains protected by moisture and water for very long time, and exhibits an improved barrier against atmospheric substances.

According to a first aspect of the invention a radiation curable, preferably photocurable resin composition is provided comprising:

(A) metal oxide particles;

(B) at least one photo initiator, preferably a radical photoinitiator, or any mixture thereof;

(C) at least one acrylate or methacrylate component with a clogP higher than 2, preferably higher than 4, more preferably higher than 5, or any mixture thereof;

(D) at least one monofunctional acrylate or methacrylate diluent component, preferably with a viscosity below 40 mPa·s at 20° C., or any mixture thereof;

(E) at least one acrylate or methacrylate component with functionality equal or higher than 3, preferably 3 or 4, or any mixture thereof, wherein Mica is excluded from the group of (A) metal oxide particles.

Such photocurable resin compositions are surprisingly stable and flowable and are surprisingly well suited for making water scavenging coatings that can be easily dispensed or printed via inkjet/valve jet printing or via gravure and flexoprinting. After curing, they give rise to water scavenging coatings characterized by exceptional water scavenging properties and transparency, and also by an exceptionally long life time. They are therefore surprisingly well suited for the manufacturing of water scavenging layers for opto-electric devices or light-emitting devices, in particular organic light emitting diodes (OLED).

Metal oxide particles can be also particle aggregates or agglomerates.

In order to avoid metal oxide (for example CaO) hydrolysis and the possibility of aggregation via hydrogen bonding, the curable matrix exhibits preferably a low water content—less than 1,000 ppm (by weight). For that reason, preferably compounds having a high hydrophobicity are used in order to prevent an elevated amount of internal water. A good indicator for the hydrophobicity is ClogP, i.e. the calculated logarithm of the octanol/water partition coefficient. A relatively high ClogP value indicates a relatively high hydrophobicity of the material. For the purpose of the present invention organic materials having a ClogP value of at least 2 are particularly suitable. The ClogP value is a well-known parameter and may be calculated for any given molecule from the knowledge of the structure of that molecule. There are a number of commercially-available computer programs performing this calculation. In the case of the present invention Osiris Property Explorer (http:www-.organic-chemistry.org/prog/peo/.) was used, which is an integral part of Actelion's in-house substance registration system. The algorithm is implemented as an incremental system adding contributions of every atom, based on atom type, atom connectivity and chemical bonding. In addition, the curable matrix is preferably dried over activated 4A molecular sieves prior to the addition of the metal oxide or CaO particles.

The definition and way of calculation of ClogP can be found under the link http://en.wikipedia.org/wiki/Partition_coefficient; in Leo A, Hansch C, and Elkins D (1971) "Partition coefficients and their uses" Chem Rev 71 (6), 525-616; in Sangster, James (1997) Octanol-Water Partition Coefficients: Fundamentals and Physical Chemistry, Vol. 2 of Wiley Series in Solution Chemistry Chichester, John Wiley & Sons Ltd. pp. 178; in Hansch, Corwin Leo A (1979) Substituent Constants for Correlation Analysis in Chemistry and Biology New York, John Wiley & Sons Ltd. pp. 178; in Leo, Albert, Hoekman D H, Hansch C (1995) Exploring QSAR, Hydrophobic, Electronic, and Steric Constants Washington, D.C., American Chemical Society.

In order to be flowable, and, in particular, for making inkjetable inks, which require very low viscosity resins (less than 30 mPa·s at printing temperature), a monofunctional acrylate or methacrylate diluent component (D) is used and the metal or calcium oxide concentration is preferably lower than 50% by weight, and more preferably lower than 20% by weight.

According to a preferred embodiment of the invention the photoinitiator is a radical photoinitiator.

According to a preferred embodiment of the invention the metal oxide particles are alkaline earth metal oxide particles, preferably CaO, BaO and/or MgO particles, and exhibit an average particle diameter of 10 to 1000 nm, preferably 15 to 500 nm, more preferably 20 to 350 nm, or even 50 to 250 nm.

The average particle diameter is calculated using the Dynamic Light Scattering technique. The apparatus used is a Malvern Zetasizer Nano ZS operating by Non Invasive Back Scatter mode for particle size measurement. Dynamic Light Scattering (also known as photon correlation spectroscopy or quasi-elastic light scattering) measures Brownian motion and relates this to the size of the particles using the Stokes-Einstein equation. It operates by illuminating the particles with a laser and analyzing the intensity fluctuations in the scattered light.

Details of the used method to measure the average particle diameter in the present invention can be found under the link http://en.wikipedia.org/wiki/Dynamic_light_scattering, and in Berne, B. J.; Pecora, R. Dynamic Light Scattering, Courier Dover Publications (2000) ISBN 0-486-41155-9.

The metal oxide or CaO particle size is preferably in the nanometer range, in order to reduce sedimentation speed to a maximum, in particular for low viscosity resins.

Nanometer range means calcium oxide fine particles having an average particle diameter (on volume basis) of 10 to 1000 nm, preferably 15 to 500 nm, more preferably 20 to 350 nm, and still more preferably 50 to 250 nm. In addition, a small particle size is highly desired for processes such as inkjet printing in order to avoid nozzle clogging, and also for making resins with a high degree of optical transparency. The problem is that the particles of calcium oxide are dried or prepared from a high temperature process (>500° C.), and, as a consequence, are strongly agglomerated. A milling/grinding process has to be performed in order to pulverize the aggregates to the nanoscale. It is known from the grinding industry that nanoscale can be reached using very small milling balls. In our process, milling balls of 0.3-0.4 mm diameter were used. Smaller balls such as 50 μm or 100 μm would even be better suited, in particular for making transparent curable resins.

According to a preferred embodiment of the invention the photocurable resin composition does not comprise any urethane(meth)acrylate, polyester(meth)acrylate, or polyethylene glycol (PEG) (meth)acrylate.

Components capable of metal oxide or CaO complexation and hydrogen bonding have to be preferably avoided, or used at very low loadings in order to avoid clumping of CaO particles and the progressive formation (only a few hours needed) of a solid-like gel which does not flow anymore. This phenomenon is aggravated as the particle size is decreased, due to the increase in surface area. Urethane acrylate building blocks, PEG (polyethylene glycol) building blocks, alkoxylated (meth)acrylates, (meth)acrylates with acidic or alcohol functionalities, polyols functionalized with (meth)acrylates are therefore preferably avoided.

According to a preferred embodiment of the invention the photocurable resin composition exhibits a viscosity at 20° C. below 500 mPa·s, preferably below 200 mPa·s, more preferably below 100 mPa·s, and/or exhibits a pot life at 60° C. longer than 29 days, preferably longer than 43 days.

Pot life at a specific temperature is defined as the time after which the resin viscosity increases of 20% of the initial value of the resin viscosity, as measured at the time of the production of the resin.

The viscosity was measured using a Haake RS 80 rotational viscometer. This type of viscometer determines directly the absolute viscosity by measuring the resistance on a shaft rotating in the fluid of interest. The viscometer is composed of a cone attached to a rotating shaft. The cone is immerged in the fluid and rotated at a constant speed. The torque required to rotate the cone is measured and then related to the fluid viscosity.

The cone type used for our viscosity measurement was a 35 mm diameter with 2° angle, the rate was set at 100 and the measurement temperature was set at 20° C.

Details of the used method to determine the viscosity can be found under the link http://en.wikipedia.org/wiki/Viscometer#Rotational_viscometers and in the operating instructions of the used viscometer.

For making dispensable and printable inks (e.g. via gravure and flexoprinting), the viscosity must be lower than 500 mPa·s at 20° C., and preferably lower than 250 mPa·s for making dispensable inks. The curable resin has preferentially a viscosity lower than 60 mPa·s at 20° C. for making inkjetable inks.

Non-flowable systems cannot be processed at all via printing techniques, such as inkjet, valve jet, gravure, and flexo printing or dispensing techniques, requiring low viscosity formulations.

Getter stickers are not practical for mass production at high speed compared to deposition of liquid resins.

It is very difficult to make thin coatings with high accuracy with high viscous pastes. A limited coating speed is achieved with viscous pastes, due to low leveling speed.

Thanks to the invention, dramatic advantages are therefore achieved in the field of the application of water scavenging materials, which were unimaginable according to the prior art.

According to another preferred embodiment of the invention the photocurable resin composition also comprises:

(F) a polybutadiene acrylate or methacrylate, a silicone acrylate or methacrylate, or a two-mole ethoxylated bisphenol A di(meth)acrylate, or any mixture thereof, whereby such component (F) exhibits preferably two (meth)acrylate functionalities.

Major components are preferably selected from polybutadiene(meth)acrylates, silicone(meth)acrylate, and other (meth)acrylate building blocks, preferably without PEG, acidic or alcohol functionalities.

According to a preferred embodiment of the invention
component (D) exhibits a ClogP higher than 2,
component (E) exhibits a ClogP higher than 1,
and/or component (F) exhibits a ClogP higher than 4,
preferably higher than 6 or 7.

According to a preferred embodiment of the invention the component C is a 1,n-diol di(meth)acrylate of a diol of the formula $HO-(CH_2)_n-OH$, whereby n is higher than 3, preferably higher than 6, more preferably higher than 10.

According to an advantageous embodiment of the invention the photocurable resin composition, after curing, is transparent, preferably the cured resin, as a film of 20 micrometer thickness, has a light transmission at 600 nm of >90%, and/or exhibits a water uptake after storage for 80 hours at 40° C. in 90% relative humidity of less than 2% of its initial weight.

According to a preferred embodiment of the invention, the resin composition comprises at least:

(A) 1-30% by weight of CaO, BaO and/or MgO particles (component A);
(B) 0.1-10% by weight of the photo initiator B;
(C) 30-80% by weight of component C, which preferably exhibits two (meth)acrylate functionalities;
(D) 5-40% by weight of the monofunctional (meth)acrylate diluent component D;
(E) 5-30% by weight of the (meth)acrylate component E with functionality equal or higher than 3; and optionally
(F) 0.1-30% by weight of component F;
based on the total weight of the composition.

According to a most preferred embodiment of the invention, the resin composition comprises at least:

(A) 4-20% by weight of CaO, BaO and/or MgO particles (component A);
(B) 0.1-5% by weight of the photo initiator B;
(C) 40-70% by weight of component C, which exhibits preferably two (meth)acrylate functionalities;
(D) 10-30% by weight of the monofunctional (meth)acrylate diluent component D;
(E) 7-20% by weight of the (meth)acrylate component E with functionality equal or higher than 3; and optionally
(F) 0.3-25% by weight of component F;
based on the total weight of the composition.

According to a second aspect of the invention a method is provided for preparing a photocurable resin according to the invention, comprising the steps of:

h) mixing and stirring together components C, D, E, and optionally F, in order to produce a mixture h, which is optionally dried;
i) incorporating optionally dehydrated calcium, barium and/or magnesium oxide (component A) into the produced mixture h, so as to obtain a mixture i;

j) Milling and/or grinding the produced mixture i, preferably via bead milling under dry nitrogen, in order to downsize the average diameter of calcium, barium and/or magnesium oxide particles, so as to produce a mixture j;

k) Adding the photoinitiator B to the produced mixture j, so as to obtain a mixture k, which is preferably stirred under dry nitrogen atmosphere.

Such method exhibits the exceptional surprising advantage that the photocurable resin according to the invention can be prepared with a one step milling process and without the use of any solvent, so that the preparation of the resin is simple, fast, inexpensive and practical.

The use of solvents and/or of a heating step for evaporating the solvent or for curing might not be compatible with the system in which the desiccant is applied. For instance, a heating step might be a critical issue when depositing the desiccant layer on a heat sensitive substrate, such as an OLED. Solvent residues might be trapped in the matrix and contaminate the system.

The dispersion of CaO in a solvent prior to dispensing the resin adds cost to the manufacturing process. In addition, it is not environmentally friendly.

The incorporation of CaO nanoparticles just before use requires the customer to be equipped with dispersing equipment, which is costly and requires expertise. A simple mixing step would not be sufficient to disperse the CaO particles to the nanometer scale.

A high number of preparation steps increases the risk of contamination of the CaO particles with humidity and, as a consequence, of the loss of water scavenging properties.

The method to prepare the photocurable composition according to the invention solves surprisingly all such problems and issues.

According to another preferred embodiment of the invention, during the milling step j) the average particle diameter of the CaO, BaO and/or MgO particles is reduced to the range of 10 to 1000 nm, preferably 15 to 500 nm, more preferably 20 to 350 nm or even 50 to 250 nm, and the produced photocurable resin k exhibits a water content less than 1000 ppm by weight.

Preferably, the CaO powder is dried, handled and milled with the resin under inert atmosphere (using inert gas with a water content of not more than 10 ppm (by mol)), in order to avoid CaO hydrolysis and the possibility of aggregation via hydrogen bonding. In the liquid curable matrix, the calcium oxide fine particles exhibit preferentially a calcium hydroxide content of less than 5% by weight and a calcium carbonate content of less than 1% by weight.

All the components have to be compatible for avoiding phase separation during the milling process.

According to a third aspect of the invention a method is provided for manufacturing a multi layer barrier stack (30) against water and oxygen penetration and diffusion, comprising the steps of:

m) Depositing a first inorganic layer (32), preferably silicon nitride or oxide, exhibiting preferably a thickness between 50 and 300 nm;

n) Depositing onto said first inorganic layer (32), preferably via ink jet printing, a first organic layer (34) of the photocurable resin according to the invention or produced with a method according to the invention;

o) exposing said first organic layer (34) to ultraviolet (UV) radiation, so as to solidify said first organic layer (34) and to produce a transparent layer exhibiting water scavenging properties;

p) applying onto said first solidified organic layer (34), preferably via ink jet printing, a second organic layer (36) of a photocurable resin not containing metal oxide particles;

q) exposing said second organic layer (36) to UV radiation, so as to solidify said second organic layer (36) and to produce a transparent layer exhibiting planarization properties;

r) Depositing onto said second solidified organic layer (36) a second inorganic layer (38), preferably silicon nitride or oxide, exhibiting preferably a thickness between 50 and 300 nm.

The first organic layer (34) exhibits advantageously a thickness between 10 and 100 micrometers, preferably between 20 and 80 micrometers.

The second organic layer (36) exhibits advantageously a thickness between 10 and 100 micrometers, preferably between 20 and 80 micrometers.

According to a fourth aspect of the invention a method is provided for manufacturing an opto-electric device, in particular an organic light emitting diode (OLED), comprising the steps of:

providing an opto-electric element and/or layer (10), providing an encapsulation comprising a multi layer barrier stack (30) produced according to the method according to the invention.

According to a fifth aspect of the invention a multi layer barrier stack (30) or opto-electric device, in particular OLED, is provided, which is obtained by a method according the invention or a resin according to the invention.

Such organic opto-electric device or OLED comprises advantageously:

an opto-electric element, a protective enclosure for protecting the opto-electric element against atmospheric substances, said protective enclosure comprising a multi-layered protective layer or multi layer barrier stack, in which a first inorganic layer, a first organic layer comprising a metal oxide, a second organic layer free from getter material and a second inorganic layer are stacked in the order named. The first organic layer is produced with the resin according to the invention or with a method according to the invention. The metal oxide is preferably CaO, BaO or MgO particles and is distributed advantageously in the first organic layer as nanometer sized particles with a density in the range of 4 to 20 wt %. The second organic layer has advantageously a thickness in the range of 10 to 100 micrometer.

Nanometer sized particles, hereinafter also denoted as nanoparticles, are understood to be particles having dimensions less than 100 nm. The getter-material distributed as nano-particles with a density in the range of 4 to 20 wt % provides for an efficient binding of moisture in the first organic layer of the OLED. In typical embodiments the density is in the range of 5 to 10 wt %, for example 5 wt %.

Despite the small size of the original getter particles, these particles tend to form clusters having a size of several micrometers. It has been surprisingly found that milling of the getter particles results in a distribution having a small average cluster size, so that the layer comprising the particles exhibit a good transparency and can be used in the manufacturing of a OLED for example. Transparency is a physical property necessary for films to be used in organic opto-electric devices or OLED. Despite such small average cluster size, it appeared that the presence of large clusters could not be fully ruled out. Accordingly, when applying a second organic layer over the first organic layer, having a conventional thickness in the range of 0.1 to 3 µm, these clusters may protrude through the second organic layer and the particles at the surface of the clusters tend to cause defects in the inorganic layer. The second organic layer has therefore advantageously a thickness substantially greater than the thickness that is conventionally applied. The first and the second inorganic layer encapsulate the first and the second organic layer so that a lateral ingress of moisture is prevented.

In a preferred embodiment the thickness of the second organic layer is at least 20 µm. This exhibits the advantage that even if tolerances in the manufacturing process cause variations in the thickness of the second organic layer then the remaining thickness is still larger than the required minimum of 10 µm. For a flexible product it is preferred that the thickness of the second organic layer is less than 100 µm. In a typical embodiment the second organic layer exhibits a thickness of about 70 µm.

In an embodiment the first organic layer has a thickness in the range of 10 to 100 µm. A substantially smaller thickness, e.g. less than 5 µm, would exhibit an insufficient getter capacity, while a substantially larger thickness, e.g. more than 200 µm, would be undesirable for a flexible product.

In an embodiment the getter particles are of an alkaline earth metal oxide. Alkaline earth metal oxides, in particular CaO, provide for a very efficient binding of water.

In an embodiment the opto-electric element is an OLED, having an opto-electric layer arranged between a cathode and an anode, and the cathode faces the multi-layered protective layer. The cathode side of the OLED is the most vulnerable part to moisture, against which the multi-layered protective layer provides an efficient and still transparent protection. At the opposite side of the OLED another protective layer may be arranged, for example a metal foil. The metal foil may also serve as a conductor for the cathode or the anode. In another embodiment the opto-electric element has a multi-layered protective layer or stack as described above on both sides.

As explained, the first organic layer is produced by curing a photocurable resin according to the invention.

The advantage of using such photocurable resins to produce the described organic opto-electric device or OLED is that the resin is stable and flowable and can be easily applied in the form of a thin film with controlled thickness. Curing time is almost instantaneous by photocuring and layers can be produced with exceptional water scavenging properties and transparency.

Components of the Resin

The photocurable resin according to the invention comprises components (A), (B), (C), (D), (E) and optionally (F):

(A) Metal Oxide Particles

The metal oxide particles with the function of getter are advantageously CaO, BaO or MgO particles, preferably CaO nanoparticles.

Also other getter materials may be used. Other alkaline earth metal oxides for this purpose which are particularly suitable are barium oxide (BaO), magnesium oxide (MgO) and strontium oxide (SrO). As an example, MgO nanopowder (Catalog Nr. 12-1400) from Strem may be obtained having the following specifications: Specific Surface Area (BET): ≥230 m$^2$/g; True Density: 3.2 g/cc; Crystallite Size: ≥8 nm; Mean Aggregate Size: 3.3 µm; Average Pore Diameter: 50 Å; Loss on Ignition: ≥8%; Total Pore Volume: ≥0.2 cc/g; Moisture Content: ≤1%; Bulk Density: 0.6 g/cc Mg Content (Based on Metal): ≥95%.

(B) Photoinitiator

In addition, the photocurable composition comprises at least one photoinitiator, preferably a free radical photoinitiator.

The free radical photoinitiator may be chosen from those commonly used to initiate radical photopolymerization. Examples of free radical photoinitiators include Irgacure® 369, benzoins, e.g., benzoin, benzoin ethers such as benzoin methyl ether, benzoin ethyl ether, benzoin isopropyl ether, benzoin phenyl ether, and benzoin acetate; acetophenones, e.g., acetophenone, 2,2-dimethoxyacetophenone, 2,2-dimethoxy-2-phenylacetophenone and 1,1-dichloroacetophenone; benzyl ketals, e.g., benzyl dimethylketal and benzyl diethyl ketal; anthraquinones, e.g., 2-methylanthraquinone, 2-ethylanthraquinone, 2-tertbutylanthraquinone, 1-chloroanthraquinone and 2-amylanthraquinone; triphenylphosphine; benzoylphosphine oxides, e.g., 2,4,6-trimethylbenzoy-diphenylphosphine oxide (Lucirin TPO); ethyl-2,4,6-trimethylbenzoylphenylphosphinate; bisacylphosphine oxides; benzophenones, e.g., benzophenone and 4,4'-bis(N, N'-dimethylamino)benzophenone; thioxanthones and xanthones; acridine derivatives; phenazine derivatives; quinoxaline derivatives; 1-phenyl-1,2-propanedione 2-O-benzoyl oxime; 4-(2-hydroxyethoxy)phenyl-(2-propyl) ketone (Irgacure® 2959); 2-methyl-1-[4-(methylthio) phenyl]-2-(4-morpholinyl)-1-propanone; 1-aminophenyl ketones or 1-hydroxy phenyl ketones, e.g., 1-hydroxycyclohexyl phenyl ketone, 2-hydroxyisopropyl phenyl ketone, phenyl 1-hydroxyisopropyl ketone, and 4-isopropylphenyl 1-hydroxyisopropyl ketone, and combinations thereof.

A content of the polymerization initiator is preferably within a range of from 0.01 to 10% by weight with respect to the total weight of the composition, more preferably from 0.5 to 7% by weight.

(C) (Meth)Acrylate with clogP>2

In addition, the photocurable composition comprises one acrylate or methacrylate component with a ClogP higher than 2, preferably higher than 4, more preferably higher than 5, or any mixture thereof.

Examples of such (meth)acrylates are CD262 (=1,12-dodecanediol dimethacrylate), methacrylate composed of a polyol and an ethylenically unsaturated acid include diester monomers each composed of a polyol and an ethylenically unsaturated carboxylic acid, such as 1,3-propanediol dimethacrylate, 1,4-butanediol dimethacrylate, 1,5-pentanediol diacrylate, 1,5-pentanediol dimethacrylate, 1,6-hexanediol diacrylate, 1,6-hexanediol dimethacrylate, 1,7-heptanediol diacrylate, 1,7-heptanediol dimethacrylate, 1,8-octanediol diacrylate, 1,8-octanediol dimethacrylate, 1,9-nonanediol diacrylate, 1,9-nonanediol dimethacrylate, 1,10-decanediol diacrylate, 1,10-decanediol dimethacrylate, 1,12-dodecanediol diacrylate, 1,12-dodecanediol dimethacrylate, 1,14-tetradecanediol diacrylate, 1,14-tetradecanediol dimethacrylate and the like.

(D) Monofunctional (Meth)Acrylate Diluent

In addition, the photocurable composition comprises a monofunctional acrylate or methacrylate diluent component, preferably with a low viscosity, for example below 40 mPa·s at 20° C., or any mixture thereof.

Specific examples of such mono functional (meth)acrylates include CHMA, CD421A, hexyl(meth)acrylate, 2-ethylhexyl(meth)acrylate, tert-octyl(meth)acrylate, isoamyl (meth)acrylate, decyl(meth)acrylate, isodecyl(meth) acrylate, stearyl(meth)acrylate, isostearyl(meth)acrylate, cyclohexyl(meth)acrylate, 4-n-butylcyclohexyl(meth)acrylate, bornyl(meth)acrylate, isobornyl(meth)acrylate, benzyl (meth)acrylate, 2-ethylhexyl diglycol(meth)acrylate, butoxyethyl(meth)acrylate, 2-chloroethyl(meth)acrylate, 4-bromobutyl(meth)acrylate, butoxymethyl(meth)acrylate, 3-methoxybutyl(meth)acrylate, alkoxymethyl(meth)acrylate, alkoxyethyl(meth)acrylate, 2-(2-methoxyethoxy)ethyl (meth)acrylate, 2-(2-butoxyethoxy)ethyl(meth)acrylate, 2,2,2-trifluoroethyl(meth)acrylate, 1H,1H,2H,2H-perfluorodecyl(meth)acrylate, 4-butylphenyl(meth)acrylate, phenyl(meth)acrylate, 2,3,4,5-tetramethylphenyl(meth) acrylate, 4-chlorophenyl(meth)acrylate, phenoxymethyl (meth)acrylate, phenoxyethyl(meth)acrylate, glycidyl(meth) acrylate, glycidyloxybutyl(meth)acrylate, glycidyloxyethyl (meth)acrylate, glycidyloxypropyl(meth)acrylate, tetrahydrofurfuryl(meth)acrylate, hydroxyalkyl(meth)acrylate, 2-hydroxyethyl(meth)acrylate, 3-hydroxypropyl(meth) acrylate, 2-hydroxypropyl(meth)acrylate, 2-hydroxybutyl (meth)acrylate, 4-hydroxybutyl(meth)acrylate, dimethylaminoethyl(meth)acrylate, diethylaminoethyl (meth)acrylate, dimethylaminopropyl(meth)acrylate, diethylaminopropyl(meth)acrylate, trimethoxysilylpropyl(meth) acrylate, trimethylsilylpropyl(meth)acrylate, polyethylene oxide monomethyl ether(meth)acrylate, oligoethylene oxide monomethyl ether(meth)acrylate, polyethylene oxide(meth) acrylate, oligoethylene oxide(meth)acrylate, oligoethylene oxide monoalkyl ether(meth)acrylate, polyethylene oxide monoalkyl ether(meth)acrylate, dipropylene glycol(meth) acrylate, polypropylene oxide monoalkyl ether(meth)acrylate, oligopropylene oxide monoalkyl ether(meth)acrylate, 2-methacryloyloxyethylsuccinic acid, 2-methylacryloyloxyhexahydrophthalic acid, 2-methacryloyloxyethyl-2-hydroxypropyl phthalate, butoxydiethylene glycol(meth)acrylate, trifluoroethyl(meth)acrylate, perfluorooctylethyl(meth) acrylate, 2-hydroxy-3-phenoxypropyl(meth)acrylate, EO-denatured phenol(meth)acrylate, EO-denatured cresol (meth)acrylate, EO-denatured nonylphenol(meth)acrylate, PO-denatured nonylphenol(meth)acrylate, and EO-denatured 2-ethylhexyl(meth)acrylate.

(E) (Meth)Acrylate with Functionality≥3

In addition, the photocurable composition comprises an acrylate or methacrylate component with functionality equal or higher than 3, preferably 3 or 4, or any mixture thereof.

Specific examples of trifunctional (meth)acrylate include SR351, trimethylolpropane tri(meth)acrylate, trimethylolethane tri(meth)acrylate, alylene oxide-denatured tri(meth) acrylate of trimethylolpropane, pentaerythritol tri(meth) acrylate, dipentaerythritol tri(meth)acrylate, trimethylolpropane tris((meth)acryloyloxypropyl)ether, alkylene-denatured tri(meth)acrylate of isocyanuric acid, dipentaerythritol propionate tri(meth)acrylate, tris((meth) acryloyloxyethyl)isocyanurate, hydroxypivalyl aldehyde-denatured dimethylolpropane tri(meth)acrylate, sorbitol tri (meth)acrylate, propoxylated trimethylolpropane tri(meth) acrylate, and ethoxylated glycerin triacrylate.

Specific examples of tetrafunctional (meth)acrylate include pentaerythritol tetra(meth)acrylate, sorbitol tetra(meth)acrylate, ditrimethylolpropane tetra(meth)acrylate, dipentaerythritol propionate tetra(meth)acrylate, and ethoxylated pentaerythritol tetra(meth)acrylate.

Specific examples of pentafunctional (meth)acrylate include sorbitol penta(meth)acrylate, and dipentaerythritol penta(meth)acrylate.

Specific examples of hexafunctional (meth)acrylate include dipentaerythritol hexa(meth)acrylate, sorbitol hexa (meth)acrylate, alkylene oxide-denatured hexa(meth)acrylate of phosphazene, and caprolactone-denatured dipentaerythritol hexa(meth)acrylate.

(F) Additional (Meth)Acrylate

In addition, the photocurable composition may optionally comprise a polybutadiene acrylate or methacrylate, a silicone acrylate or methacrylate, or a two-mole ethoxylated bisphenol A di(meth)acrylate, or any mixture thereof, whereby such component (F) exhibits preferably two (meth) acrylate functionalities.

Examples of such (meth)acrylates are polydiene(meth) acrylates like polybutadiene(meth)acrylate, polydiene di(meth)acrylates like polybutadiene di(meth)acrylate as SR307 and CN301 from Sartomer, polyisoprene diacrylate and the like, 2 mole alkoxylated bisphenol A di(meth) acrylate as 2 mole ethoxylated bisphenol A di(meth)acrylate as SR348L, silicone(meth)acrylates and silicone di(meth) acrylates like CN9800.

Preferably, the inventive compositions should not comprise urethane(meth)acrylates, polyester(meth)acrylates, polyethylene glycol (PEG) (meth)acrylates. Such compounds may destroy the water scavenging properties of the film and may react with the CaO nanoparticles.

A dispersant may be added, in order to increase the dispersibility of getter particles into the organic matrix. The dispersant may be a low molecular weight organic dispersant, a high molecular weight organic dispersant, a low molecular weight organic/inorganic complex dispersant, a high molecular weight organic/inorganic complex dispersant, an organic/inorganic acid, or the like. The dispersant serves to disperse the getter particles homogeneously in the organic layer, for example, by avoiding aggregation, and thus minimizes the size of the getter particles, which remains few nm, so as to produce a transparent moisture absorption layer.

The photocurable composition may additionally include other components, for example, stabilizers, modifiers, tougheners, antifoaming agents, leveling agents, thickening agents, flame retardants, antioxidants, pigments, dyes, fillers, and combinations thereof.

BRIEF DESCRIPTION OF THE DRAWINGS

Some aspects of the present invention are described in more detail in the drawing.

FIG. 1 shows in detail a cross-section of a first embodiment of an opto-electric device according to an aspect of the invention.

DETAILED DESCRIPTION OF EMBODIMENTS

Components

Table I describes components A, B, C, D, E and F used for the manufacture of the photocurable compositions according to the present invention.

Preparation of the Resins

The raw materials—except for the photoinitiators—were mixed together and stirred for 1 h at 340 rpm at 25° C. The mixture was dried over 4A molecular sieves during 24 hours (sieves dried at 150° C. under vacuum during 2 hours), then filtered prior to mixing with dry CaO powder.

The CaO particles were obtained from Strem Chemicals (Catalog #20-1400) and had the following product specifications: Specific Surface Area (BET): ≥20 m2/g; Bulk Density: 0.5 g/cc; Crystallite Size: ≤40 nm; True Density: 3.3 g/cc; Average Pore Diameter: 165 Å; Mean Aggregate Size: 4 μm; Total Pore Volume: ≥0.1 cc/g; Ca Content (Based on Metal): >99.8%. The particle size distribution was measured with a dynamic light scattering tool (DLS), a Zetasizer Nano of Malvern Instruments. The distribution was a three-modal distribution having a first maximum at about 60 nm, a second peak at about 550 nm and a third peak at about 5 μm.

CaO was dehydrated for 1 hour at 900° C. in air, then slowly cooled down to 200° C., and transferred quickly to a dry nitrogen filled enclosure, where it was ultimately cooled to room temperature prior incorporation into the curable matrix. As evident from SEM pictures, the CaO particles are strongly aggregated after and even before the calcination process, with particles aggregates up to 10 micrometers in size. Such SEM pictures highlight the necessity to perform a milling/grinding step for downsizing the particles to the nanometer scale.

In order to determine calcium oxide purity, the calcium hydroxide content and calcium carbonate content were determined via Thermogravimetric analysis (TGA measurements and elemental analyses). Quantitative analysis is carried out on combustion. The used measurement method can be found under the link http://en.wikipedia.org/wiki/Thermogravimetric analysis or in Mansfield, E.; Kar, A.; Quinn, T. P.; Hooker, S. A. (2010). "Quartz Crystal Microbalances for Microscale Thermogravimetric Analysis". Analytical Chemistry 82 (24). Calcium carbonate decomposes into calcium oxide at high temperatures (above 750° C.) and calcium hydroxide decomposes into calcium oxide above 400° C. More than 98% purity was obtained after the drying process.

A steel milling chamber filled with 85% (in volume) of yttrium stabilized zirconium oxide milling beads of 0.3-0.4 mm was used for the milling process (in a Dynomill KDL equipment with a gap seal of 0.1 mm). The milling equipment was connected to a reactor to allow recirculation of the mixture, and the complete system was put under dry nitrogen flow for keeping it protected from moisture. A cryostat was used for cooling the reactor and maintaining the milling chamber temperature at 21° C. (±3° C.) during the milling process. The recirculation and milling were stopped once the desired particle size was reached.

In case of example 18 (F18 in Table 2), the CaO particles were shaken into the curable matrix under dry nitrogen during 2 hours with a Retch PM100 ball milling equipment using a 250 ml zirconium oxide bowl and 10 mm diameter zirconium oxide milling balls.

The resin milled via bead milling was diluted by 100 times with the curable matrix (without photoinitiator) for determining the particle size distribution using a Zeta Sizer Nano ZS from Malvern Instruments. Particle size distribution measurements were only taken on stable resins, because aggregation phenomena were interfering with signal resulting from "brownian motion" of particles of different sizes.

In order to finalize the formulation preparation, the photoinitiator was added to the curable matrix after the milling process, and the composition was stirred for 1 h at 340 rpm at room temperature—all steps being performed under a dry nitrogen atmosphere. The photoinitiator was added after the milling process because it may induce problems during the particle size measurements via dynamic light scattering: resin curing might occur upon laser exposure.

EXAMPLES

Table II a and b show the compositions of the photocurable resins (examples F1-F20).

ClogP of the components is indicated.

The viscosity of the resins at 20° C.—determined immediately after preparation—is indicated.

The stability of the resins at 25° C. and at 60° C., and the appearance after 4 days at 60° C. is indicated. A resin is considered stable, if it has a pot life at 60° C. of longer than 29 days, preferably longer than 43 days, meaning that the viscosity increase of the resin is less than 20% compared to its initial viscosity. At the same time, no solid like gel formation or sedimentation of the particles is detected.

The resins which fulfill said stability requirements and exhibits a good transparency after curing can be advantageously used to produce water scavenging layers for opto-electric devices, in particular OLED.

Tables II a and b also indicate the measured average particle diameter (z) and the polydispersity (PDI) of the produced compositions.

From Table II it is evident that only the inventive compositions F1, F3, F15, F16, F17, F19 and F20 fulfill the necessary stability requirements and are suited to produce water scavenging layers for opto-electric devices, in particular OLED. Said compositions exhibit a white liquid appearance after 4 days at 60° C., and become transparent after curing. They are stable at 25° C. and at 60° C., and flowable with an initial viscosity less than 100 mPa·s.

In said compositions component A are CaO nanoparticles, component B is Irgacure 369, component C is CD262, component D is CHMA or CD421A, component E is SR351, component F is SR348L, CN9800, CN301 or SR307.

Table II shows that the inventive compositions do not comprise urethane(meth)acrylates, polyester(meth)acrylates, polyethylene glycol (PEG) (meth)acrylates. Such compounds may destroy the water scavenging properties of the film and may react with the CaO nanoparticles. Actually, the negative effects produced by such compounds are exemplified by the non-inventive examples in Table II.

The above mentioned inventive photocurable compositions are well suited to produce water scavenging layers for multilayer thin film barrier stacks used for protecting moisture and oxygen sensitive devices, such as organic LEDs, OPV, GIGS solar cells, liquid crystal displays, electrophoretic displays, electrochromic displays, thin film batteries etc.

Said inventive photocurable compositions exhibit the advantage that the preparation process is carried out in one step, without the need to pre-process the CaO particles prior to their addition into the resin.

Curable and printable inks can be prepared using such inventive photocurable compositions, which is of considerable interest in printed electronic applications, such as the manufacturing of organic light emitting diodes, lithium ion batteries, and the like. No drying step or heating step is needed, since there is no solvent to evaporate, so that sensitive electronic devices are not damaged during the application of the inventive resins.

Said inventive photocurable compositions can be supplied as a liquid one-component system, which remains stable for days or months.

Said inventive photocurable compositions provide flowable and curable inks with an elevated dehydrating power, because they hardly contains any calcium hydroxide and calcium carbonate, which are inactive in dehydration.

Since the CaO particles are milled to the nanoscale, curable inks with an exceptionally high degree of optical transparency can be prepared.

Test Results for the Resin of Example 20

The uncured liquid resin of example 20 exhibits the physical properties indicated in Table III:

TABLE III

| PROPERTIES | UNITS | VALUES |
|---|---|---|
| Appearance | | White, low viscosity liquid |
| Surface tension | mN/m | 28.7-31.6 at 22-25° C. (2 tests, 2 batches) |
| Refractive index | 24.2° C. | 1.475 (2 tests, 2 batches) |
| Density (ISO1183-3) | g/cm$^3$ | 0.998-0.999 (2 batches-2 tests each) |
| Viscosity @ 20° C. | mPa s | 40-50 |
| Viscosity @ 60° C. | mPa s | 9-13 |
| Typical particle diameter-z average | nm | 150-350 |
| Particle size distribution-PDI | | ≤0.3 |
| Outgassing at 1 mbar for 5 h | Weight % | ≤0.2 (2 tests, 2 batches) |

The uncured liquid resin exhibits a pot life longer than 4 months (viscosity increase ≤20%).

The resin of example 20 was applied by inkjet printing on a silicon nitride substrate in conditions of low humidity (<30 ppm) with a layer thickness of 10-40 µm and then cured in the UV (ultraviolet) wavelength range 250-400 nm (by LED curing) with a UV dose of 1 J/cm2 under conditions of no oxygen (<20 ppm) and low humidity (<30 ppm). Table IV shows the measured physical and mechanical properties of the obtained cured film (UV exposure, 1 J/cm$^2$).

TABLE IV

| MEASUREMENT | TEST METHOD | VALUES |
|---|---|---|
| E Modulus at 20° C. on thin films (50-100 µm) | Non-ISO via DMTA[1] | 1.3-1.5 GPa (2 tests, 2 batches) |
| E Modulus at 60° C. on thin films (50-100 µm) | Non-ISO via DMTA[1] | 590-690 MPa (2 tests, 2 batches) |
| E Modulus at 100° C. on thin films (50-100 µm) | Non-ISO via DMTA[1] | 230-282 MPa (2 tests, 2 batches) |
| E Modulus at 120° C. on thin films (50-100 µm) | Non-ISO via DMTA[1] | 158-186 MPa (2 tests, 2 batches) |
| Refractive index | 23.9° C .-100 µm film | 1.51 (2 tests, 2 batches) |
| UV-Visible transmission (400, 600, 800 nm) | UV-Visible spectroscopy-20 µm | 81%, 97%, 99% (2 tests, 2 batches) |
| Hardness | Pencil hardness, 24° C./40% RH- 20 µm on glass | 1H-2H (2 tests, 2 batches) |
| Mean surface roughness | Profilometry-1.5 mm scan Length-2 µm tip radius | Ra ≤ 10 nm (1 test, 1 batch) |
| Surface energy | Sessile drop method | Total: 42-45 mN/m (2 tests, 2 batches) Polar: 0.00-0.02 mN/m Disperse: 42-45 mN/m |
| Water uptake at saturation (WU) | 40° C./90% RH | 2% ≥ WU 1.8% |

[1]Dynamic Thermal Analysis Measurements (DMTA) performed on visco-analyser Metravib VA-3000. Modulus is recorded in tension during thermal scanning from −30° C. to 150° C. at 3° C./min (×2) under a static load, 1 Hz frequency, 15 µm displacement. The reported values correspond to the first scan.

The Water uptake at saturation (WU) has been measured as the weight increase in % by moisture absorption after 80 hours at 40° C. and humidity 90% RH. A saturation of the weight increase is reached after such aging time. The weight increase of the specimen after said aging time is comprised between 1.8% and 2% of the initial weight of the specimen.

Table IV demonstrates that the obtained mechanical properties, in particular the elastic modulus, the obtained optical properties, in particular the light transmission, and the obtained low water uptake make the produced film very well suited as a water scavenging layer for an opto-electric device.

Manufacturing of the Opto-Electric Device

In the following, the materials, methods, and examples are illustrative only and not intended to be limiting.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present.

FIG. 1 schematically shows a cross-section of an inventive opto-electric device comprising the inventive multi-layered protective barrier stack.

The organic opto-electric device shown in FIG. 1 comprises an opto-electric element 10, that is enclosed by a protective enclosure for protecting the opto-electric element against atmospheric substances in particular water vapor. The protective enclosure comprises a multi-layered protective layer or barrier stack 30, in which a first inorganic layer 32, a first organic layer 34 comprising a metal oxide, a second organic layer 36 free from getter material and a second inorganic layer 38 are stacked in the order named. In the embodiment shown the multilayer protective layer 30 has a further organic layer 40.

The material of the organic layers exhibits preferably a low specific water vapor transmission rate and a high hydrophobicity.

The first organic layer 34 has been produced by curing a photocurable resin according to the invention or by a method according to the invention. In particular, composition F20 has been experimentally used.

The metal oxide is distributed in the first organic layer 34 as nanometer sized particles with a density in the range of 4 to 20 wt %. The second organic layer 36 has a thickness in the range of 10 to 100 micrometer.

In the embodiment shown the metal oxide is an alkaline earth metal oxide. In particular, the selected alkaline earth metal oxide is calcium oxide.

As explained, the organic material experimentally used for the first organic layer 34 is a cured inventive composition, in particular resin composition F20. The second organic layer 36 and the further organic layer 40 may be obtained by curing a photocurable resin according to the invention, which, however, does not comprise any metal oxide, CaO, BaO or MgO particle. Such resin would exhibit therefore the same composition as the inventive resins, but without any getter particle. The function of the second organic layer 36 (planarization layer) is not to protect from water or oxygen, but to create a plane smooth surface, deprived of any asperity or metal oxide particle, onto which a continuous resistant thin layer of silicone nitride or oxide absolutely free of any discontinuity can be created. In particular, a resin composition corresponding to F20, but without any addition of CaO particles, has been experimentally used to produce the second organic layer 36.

The organic layers may be applied by all kinds of coatings techniques, such spin coating, slot-die coating, kiss-coating, hot-melt coating, spray coating, etc. and all kinds of printing techniques, such as inkjet printing, gravure printing, flexographic printing, screen printing, rotary screen printing, etc.

The second organic layer 36 as well can be deposited by ink-jet printing, for example.

For such second organic layer 36, the same organic resin was used as the organic resin used for the first organic layer, deprived however of any metal oxide particle. Alternatively, a different photocurable resin may be used, without metal oxide particles.

Curing or drying may exemplary occur by irradiation of the wet material, pure, or suitably formulated with a photo- or heat-sensitive radical initiator, with UV-light, visible light, infrared light or heat, E-beam, gamma-rays or any combination of the aforementioned.

The first and the second organic layer were both cured experimentally by radiation with a Dymax Flood Lamp at a power density of 33 mW/cm$^2$ during 90 s.

The inorganic layer(s) 32, 38 may be formed by any ceramic, including but not limited to metal oxides, metal nitrides and metal carbides. Suitable materials therefore are for example silicon nitride, silicon oxide ($SiO_2$), aluminum oxide ($Al_2O_3$), titanium oxide ($TiO_2$), indium oxide ($In_2O_3$), tin oxide ($SnO_2$), indium tin oxide (ITO, $In_2O_3+SnO_2$), SiC, silicon oxynitride (SiON) and combinations thereof.

The inorganic layers 32 and 38 have a water vapor transmission rate of at most $10^{-4}$ g·m$^{-2}$·day$^{-1}$. The inorganic layer(s) are in practice substantially thinner than the organic layers. The inorganic layers should have a thickness in the range of 10 to 1000 nm, preferably in the range of 100 to 300 nm. An inorganic layer with a thickness less than 10 nm exhibits in practice insufficient barrier properties. Deposition of an inorganic layer with a thickness of at least 100 nm is preferred in that relatively large tolerances in the manufacturing process are allowed without having consequences for the quality of the product. For flexible products the thickness of the inorganic layers preferably does not exceed 300 nm. A thickness larger than 1000 nm does not further improve the barrier properties of the inorganic layer, while the duration of the deposition process is economically unattractive.

In the experimentally manufactured opto-electric device, the first and the second inorganic layers 32, 38 are silicone nitride layers having a thickness of 150 nm. The first organic layer 34 comprises 5 wt % CaO particles embedded in a matrix of resins according to the invention (F20) and has a thickness of about 80 μm.

The second organic layer 36 is a layer of a resin according to the invention (F20) free from metal oxide particles and having a thickness of about 70 μm. The further organic layer 40, forming the top-layer of the multilayer protective layer 30 is also a layer of resins according to the invention (F20) free from metal oxide particles and having a thickness of about 50 μm.

As illustrated in FIG. 1, in practice the inorganic layers 32, 38 exhibit defects 32a, 38A, such as pinholes. The organic layers 34 and 36 serve to decouple the pinholes of the layers 32 and 38, to reduce a flow of atmospheric substances towards the opto-electric element 10. The first organic layer 34 comprising the nanometer sized metal oxide particles captures a significant portion of these substances that flow through the second inorganic layer 38. The second organic layer 36, having a thickness of at least 10 μm, prevents that clusters of these metal oxide particles can damage the second inorganic layer 38.

In the embodiment shown the second organic layer 36 extends laterally beyond the first organic layer 34.

In the embodiment shown, the multilayered protective layer 30 exhibits a top layer 40 of a further organic material.

The inorganic layers 32, 38 extend beyond the organic layers 34, 36 and form an encapsulation of the organic layers 34, 36, so that also a lateral ingress of atmospheric substances into the organic layers 34, 36 is prevented.

The first organic layer 34 covers the area defined by the opto-electric element 10 completely. Furthermore, the second organic layer 36 extends laterally beyond the area of the first organic layer 34. In particular, the second organic layer 36 extends laterally over its full circumference beyond the area of the first organic layer 34.

The lateral dimensions of the inorganic layers 32, 38 extend beyond the opto-electric element 10, and the organic layers 34, 36. In particular, the inorganic layers 32, 38 encapsulate the organic layers 34, 36. The multilayer protective layer 30 (barrier stack) forms part of a protective encapsulation of the opto-electric element 10. The encapsulation may comprise a further multilayer protective layer or another type of layer that has sufficient barrier properties, such as a glass plate, a metal foil etc.

In the depicted embodiment, the opto-electric element 10 is an OLED. The OLED has a light emitting layer arranged between a cathode and an anode. In case the device has a metal substrate, the latter may function as an electrode. For an improved functionality the OLED typically has additional functional layers, such as a hole injection layer, a hole transport layer, an electron injection layer, an electron injection layer etc.

Although the present invention is specifically explained with reference to an OLED, the invention is equally applicable to opto-electric devices having another opto-electric element, such as an electrochromic device, or a photovoltaic device.

As used herein, the terms "comprises," "comprising," "includes," "including," "has," "having" or any other variation thereof, are intended to cover a non-exclusive inclusion.

TABLE I

| Trade Name | Supplier | Chemical Name | CAS number | Structure |
|---|---|---|---|---|
| CD262 | Sartomer | 1,12 dodecanediol dimethacrylate | Proprietary | $CH_2=C(CH_3)-C(=O)-O-(CH_2)_{12}-O-C(=O)-C(CH_3)=CH_2$ |
| SR351 | Sartomer | Trimethylolpropanetriacrylate | 15625-89-5 | (structure shown) |
| CHMA | BASF | Cyclohexylmethacrylate | 101-43-9 | (structure shown) |
| SR348C | Sartomer | Three-mole ethoxylated bisphenol A dimethacrylate | Not available | (structure shown) |
| SR348L | Sartomer | Two-mole ethoxylated bisphenol A dimethacrylate | Not available | (structure shown) |

TABLE 1-continued

| Trade Name | Supplier | Chemical Name | CAS number | Structure |
|---|---|---|---|---|
| SR307 | Sartomer | Poly(butadiene) Diacrylate | Not assigned | (structure shown) |
| CN301 | Sartomer | Poly(butadiene) Dimethacrylate | Not assigned | Proprietary |
| CN981 | Sartomer | Aliphatic polyester/polyether based urethane diacrylate oligomer | Proprietary | Proprietary |
| Art resin 106S30B | Huntsman | Mixture of acrylates and polyethylene glycol acrylates | Proprietary | Proprietary |
| Genomer 4205 | Rahn | Aliphatic urethane methacrylate | Not available | |
| FIT 852 | Esstech | Urethane dimethacrylate | 72869-86-4 + 868-77-9 | (structure shown) |
| SR480 | Sartomer | 10 mole ethoxylated bisphenol A dimethacrylate | 41637-38-1 | (structure shown) |
| CN972 | Sartomer | Aromatic polyether based urethane triacrylate oligomer | Proprietary | Proprietary |
| CN9800 | Sartomer | Difunctional aliphatic silone acrylate oligomer | Proprietary | Proprietary |
| SR610 | Sartomer | Polyethylene glycol (600) diacrylate | 26570-48-9 | (structure shown) |
| Ebecryl 837 | Cytec | Multifunctional polyester acrylate | Proprietary | Proprietary |

TABLE 1-continued

| Trade Name | Supplier | Chemical Name | CAS number | Structure |
|---|---|---|---|---|
| ACMO | Rahn | Acryloyl morpholine | 5117-12-4 | (acryloyl morpholine structure) |
| NVC | BASF | N-Vinyl Caprolactam | 2235-00-9 | (N-vinyl caprolactam structure) |
| Ebecryl 210 | Cytec | Aromatic difunctional urethane acrylate | Proprietary | Proprietary |
| Irgacure 369 | BASF | 2-Benzyl-2-dimethylamino-4-morpholinobutyrophenone | 119313-12-1 | (structure with morpholine, phenyl, C(=O), C(NMe$_2$)(Et)(CH$_2$Ph)) |

TABLE II a

| RAW MATERIALS | ClogP | F1 (wt %) | F2 (wt %) | F3 (wt %) | F4 (wt %) | F5 (wt %) |
|---|---|---|---|---|---|---|
| Desiccant | | | | | | |
| CaO | | 5 | 5 | 5 | 5 | 5 |
| (Meth)acrylates | | | | | | |
| CD262 | 6.38 | 48.45 | 48.45 | 48.45 | 48.45 | 48.45 |
| SR351 | 1.58 | 9.12 | 9.12 | 9.12 | 9.12 | 9.12 |
| CHMA | 2.71 | 20 | 20 | 20 | 20 | 20 |
| SR348L | >4 | 16.44 | | | | |
| SR348C | >4 | | 16.44 | | | |
| CN9800 | >2 | | | 16.44 | | |
| CN981 | CD | | | | 16.44 | |
| Art resin 106S30B | CD | | | | | 16.44 |
| Genomer 4205 | CD | | | | | |
| FIT 852 | >3 | | | | | |
| SR480 | 4.58 | | | | | |
| SR610 | <1 | | | | | |
| Ebecryl 210 | CD | | | | | |
| Photoinitiator | | | | | | |
| Irgacure 369 | | 0.95 | 0.95 | 0.95 | 0.95 | 0.95 |
| TOTAL | | 100 | 100 | 100 | 100 | 100 |
| Process | | Bead-milling | Bead-milling | Bead-milling | Bead-milling | Bead-milling |
| Viscosity at 20° C. (mPa · s) | | 26-27 | 23-24 | 19-20 | 34 | 58 |
| Miscibility at 25° C. | | OK | OK | OK | OK | OK |
| Stability at 25° C. | | >43 days-<20% increase in viscosity | >43 days-20% increase in viscosity | >43 days-<20% increase in viscosity | 1-2 days-solid like gel formation | 1-2 days-Solid like gel formation |
| Stability at 60° C. | | >43 days-<20% increase in viscosity | 4 days - PS | >43 days-<20% increase in viscosity | 1 day-Solid like gel formation | 1 day - Solid like gel formation |
| Appearance after 4 days at 60° C. | | White liquid | PS + bottom layer = solid like gel containing CaO | White liquid | Solid like gel formation | Solid like gel formation |
| z average (r. nm) | | 290 | 208 | 435 | NM | NM |
| PDI | | 0.13 | 0.11 | 0.16 | NM | NM |

NM: Not Measurable
PS: Phase Separation
CD: Cannot be determined-molecular structure kept confidential by supplier TABLE II b

| RAW MATERIALS | ClogP | F6 (wt %) | F7 (wt %) | F8 (wt %) | F9 (wt %) | F10 (wt %) |
|---|---|---|---|---|---|---|
| Desiccant | | | | | | |
| CaO | | 5 | 5 | 5 | 5 | 5 |
| (Meth)acrylates | | | | | | |
| CD262 | 6.38 | 48.45 | 48.45 | 48.45 | 48.45 | 48.45 |
| SR351 | 1.58 | 9.12 | 9.12 | 9.12 | 9.12 | 9.12 |
| CHMA | 2.71 | 20 | 20 | 20 | 20 | 20 |
| SR348L | >4 | | | | | |
| SR348C | >4 | | | | | |
| CN9800 | >2 | | | | | |
| CN981 | CD | | | | | |
| Art resin 106S30B | CD | | | | | |
| Genomer 4205 | CD | 16.44 | | | | |
| FIT 852 | >3 | | 16.44 | | | |
| SR480 | 4.58 | | | 16.44 | | |

TABLE II b-continued

| RAW MATERIALS | ClogP | F6 (wt %) | F7 (wt %) | F8 (wt %) | F9 (wt %) | F10 (wt %) |
|---|---|---|---|---|---|---|
| SR610 | <1 | | | | 16.44 | |
| Ebecryl 210 | CD | | | | | 16.44 |
| Photoinitiator | | | | | | |
| Irgacure 369 | | 0.95 | 0.95 | 0.95 | 0.95 | 0.95 |
| TOTAL | | 100 | 100 | 100 | 100 | 100 |
| Process | | Bead-milling | Bead-milling | Bead-milling | Bead-milling | Bead-milling |
| Viscosity at 20° C. (mPa · s) | | 38-39 | 49-50 | 32-33 | 40-41 | 65-66 |
| Miscibility at 25° C. | | OK | OK | OK | OK | OK |
| Stability at 25° C. | | 1-2 days-Solid like gel formation | 1-2 days-Solid like gel formation | 1-2 days-Solid like gel formation | 1-2 days-Solid like gel formation | 1-2 days-Solid like gel formation |
| Stability at 60° C. | | 1 day-Solid like gel formation | 1 day-Solid like gel formation | 1 day-Solid like gel formation | 1 day-Solid like gel formation | 1 day-Solid like gel formation |
| Appearance after 4 days at 60° C. | | Solid like gel formation | Solid like gel formation | Solid like gel formation | Solid like gel formation | Solid like gel formation |
| z average (r. nm) | | NM | NM | NM | NM | NM |
| PDI | | NM | NM | NM | NM | NM |

NM: Not Measurable
PS: Phase Separation
CD: Cannot be determined-molecular structure kept confidential by supplier TABLE II c

| RAW MATERIALS | ClogP | F11 (wt %) | F12 (wt %) | F13 (wt %) | F14 (wt %) | F15 (wt %) |
|---|---|---|---|---|---|---|
| Desiccant | | | | | | |
| CaO | | 5 | 5 | 5 | 5 | 5 |
| (Meth)acrylates | | | | | | |
| CD262 | 6.38 | 48.45 | 48.45 | 48.45 | 48.45 | 48.45 |
| SR351 | 1.58 | 9.12 | 9.12 | 9.12 | 9.12 | 9.12 |
| CHMA | 2.71 | 20 | 20 | 20 | 20 | 20 |
| CD421A | | | | | | |
| CN972 | CD | 16.44 | | | | |
| ACMO | 0.32 | | 16.44 | | | |
| NVC | 1.64 | | | 16.44 | | |
| Ebecryl 837 | CD | | | | 16.44 | |
| CN301 | >8 | | | | | 16.44 |
| SR307 | >7 | | | | | |
| Photoinitiator | | | | | | |
| Irgacure 369 | | 0.95 | 0.95 | 0.95 | 0.95 | 0.95 |
| TOTAL | | 100 | 100 | 100 | 100 | 100 |
| Process | | Bead-milling | Bead-milling | Bead-milling | Bead-milling | Bead-milling |
| Viscosity at 20° C. (mPa · s) | | 13-14 | 70-71 | 23-24 | 30 | 83-84 |
| Miscibility at 25° C. | | PS | OK | PS | PS | OK |
| Stability at 25° C. | | PS + bottom layer = solid like gel containing CaO | 1-2 days-Solid like gel formation | PS + bottom layer = solid like gel containing CaO | PS + bottom layer = solid like gel containing CaO | >43 days-<20% increase in viscosity |
| Stability at 60° C. | | PS + bottom layer = solid like gel containing CaO | 1 day - Solid like gel formation | PS + bottom layer = solid like gel containing CaO | PS + bottom layer = solid like gel containing CaO | >43 days-<20% increase in viscosity |

TABLE II c-continued

| RAW MATERIALS | ClogP | F11 (wt %) | F12 (wt %) | F13 (wt %) | F14 (wt %) | F15 (wt %) |
|---|---|---|---|---|---|---|
| Appearance after 4 days at 60° C. | | PS + bottom layer = solid like gel containing CaO | Solid like gel formation | PS + bottom layer = solid like gel containing CaO | PS + bottom layer = solid like gel containing CaO | White liquid |
| z average (r. nm) | | NM | NM | NM | NM | 168 |
| PDI | | NM | NM | NM | NM | 0.075 |

TABLE II d

| RAW MATERIALS | Clog P | F16 (wt %) | F17 (wt %) | F18 (wt %) | F19 (wt %) | F20 (wt %) |
|---|---|---|---|---|---|---|
| Desiccant | | | | | | |
| CaO | | 5 | 5 | 5 | 10 | 5 |
| (Meth)acrylates | | | | | | |
| CD262 | 6.38 | 64.45 | 48.45 | 64.89 | 45.9 | 48.45 |
| SR351 | 1.58 | 9.12 | 9.12 | 9.12 | 8.7 | 9.12 |
| CHMA | 2.71 | 20 | 20 | 20 | | 20 |
| CD421A | | | | | 18.9 | |
| CN972 | CD | | | | | |
| ACMO | 0.32 | | | | | |
| NVC | 1.64 | | | | | |
| Ebecryl 837 | CD | | | | | |
| CN301 | >8 | 0.44 | | | | |
| SR307 | >7 | | 16.44 | | 15.6 | 16.44 |
| Photoinitiator | | | | | | |
| Irgacure 369 | | 0.95 | 0.95 | 0.95 | 0.9 | 0.95 |
| TOTAL | | 100 | 100 | 100 | 100 | 100 |
| Process | | Bead-milling | Bead-milling | Ball shaking | Bead-milling | Bead-milling |
| Viscosity at 20° C. (mPa · s) | | 16-17 | 40-41 | 41-42 | 45-50 | 40-41 |
| Miscibility at 25° C. | | OK | OK | OK | OK | OK |
| Stability at 25° C. | | >43 days- <20% increase in viscosity | >43 days- <20% increase in viscosity | 3 days-CaO sedimentation | >29 days <20% increase in viscosity | >43 days- <20% increase in viscosity |
| Stability at 60° C. | | >43 days- <20% increase in viscosity | >43 days- <20% increase in viscosity | 1 day-CaO sedimentation | >29 days <20% increase in viscosity | >43 days- <20% increase in viscosity |
| Appearance after 4 days at 60° C. | | White liquid | White liquid | All CaO sedimented at the bottom | White liquid | White liquid |
| z average (r. nm) | | 417 | 233 | NM | 270 | 268 |
| PDI | | 0.13 | 0.05 | NM | 0.1 | 0.05 |

The invention claimed is:

1. A photocurable resin composition comprising:
   (A) 1-30% by weight of alkaline earth metal oxide particles selected from the group consisting of dehydrated CaO, dehydrated BaO and dehydrated MgO particles;
   (B) 0.1-10% by weight of at least one photoinitiator, or any mixture thereof;
   (C) 30-80% by weight of at least one acrylate or methacrylate component with a ClogP higher than 2, or any mixture thereof;
   (D) 5-40% by weight of at least one monofunctional acrylate or methacrylate diluent component, or any mixture thereof;
   (E) 5-30% by weight of at least one acrylate or methacrylate component with functionality equal or higher than 3, or any mixture thereof;
   (F) 0.1-30% by weight of a polybutadiene acrylate or methacrylate, a silicone acrylate or methacrylate, or a two-mole ethoxylated bisphenol A di(meth)acrylate, or any mixture thereof;
   based on the total weight of the composition;
   wherein the photocurable resin exhibits a water content of less than 1000 ppm by weight;
   wherein Mica is excluded from the group of (A) alkaline earth metal oxide particles; and
   wherein the photocurable resin composition does not comprise any urethane (meth)acrylate, polyester (meth)acrylate, or polyethylene glycol (PEG) (meth)acrylate.

2. A photocurable resin composition according to claim 1, wherein the alkaline earth metal oxide particles A exhibit an average particle diameter of 10 to 1000 nm.

3. A photocurable resin composition according to claim 1, which exhibits a viscosity at 20° C. below 500 mPa·s, and/or which exhibits a pot life at 60° C. longer than 29 days.

4. A photocurable resin composition according to claim 1, wherein component (D) exhibits a ClogP higher than 2, component (E) exhibits a ClogP higher than 1, and/or component (F) exhibits a ClogP higher than 4.

5. A photocurable resin composition according to claim 1, wherein component C is a 1,n-diol di(meth)acrylate of a diol of the formula HO—$(CH_2)_n$—OH, whereby n is higher than 3.

6. A photocurable resin composition according to claim 1, which, after curing, is transparent.

7. A photocurable resin composition according to claim 1 comprising at least:
   (A) 4-20% by weight of dehydrated CaO, dehydrated BaO and/or dehydrated MgO particles (component A);
   (B) 0.1-5% by weight of the photo initiator B;
   (C) 40-70% by weight of component C;
   (D) 10-30% by weight of the monofunctional (meth)acrylate diluent component D;
   (E) 7-20% by weight of the (meth)acrylate component E with functionality equal or higher than 3; and
   (F) 0.3-25% by weight of component F;
   based on the total weight of the composition.

8. Method for preparing a photocurable resin composition according to claim 1, comprising the steps of:
   h) mixing and stirring together components C, D, E, and optionally F, in order to produce a mixture h, which is optionally dried, wherein component F is a polybutadiene acrylate or methacrylate, a silicone acrylate or methacrylate, or a two-mole ethoxylated bisphenol A di(meth)acrylate, or any mixture thereof;
   i) incorporating dehydrated calcium, dehydrated barium and/or dehydrated magnesium oxide (component A) into the produced mixture h, so as to obtain a mixture i;
   j) milling and/or grinding the produced mixture i, in order to downsize the average diameter of dehydrated calcium, dehydrated barium and/or dehydrated magnesium oxide particles, so as to produce a mixture j;
   k) adding the photoinitiator B to the produced mixture j, so as to obtain a mixture k.

9. Method for preparing a photocurable resin composition according to claim 8, wherein during the milling step j) the average particle diameter of the dehydrated CaO, dehydrated BaO and/or dehydrated MgO particles is reduced to the range of 10 to 1000 nm, and/or wherein the produced photocurable resin k exhibits a water content less than 1000 ppm by weight.

10. Method for manufacturing a multi layer barrier stack against water and oxygen penetration and diffusion, comprising the steps of:
   m) depositing a first inorganic layer;
   n) depositing onto said first inorganic layer, a first organic layer of the photocurable resin composition according to claim 1;
   o) exposing said first organic layer to ultraviolet radiation, so as to solidify said first organic layer and to produce a transparent layer exhibiting water scavenging properties;
   p) applying onto said first solidified organic layer, a second organic layer of a photocurable resin not containing metal oxide particles;
   q) exposing said second organic layer to UV radiation, so as to solidify said second organic layer and to produce a transparent layer exhibiting planarization properties;
   r) depositing onto said second solidified organic layer a second inorganic layer.

11. Method for manufacturing a multi layer barrier stack according to claim 10, whereby the first organic layer exhibits a thickness between 10 and 100 micrometers, and/or whereby the second organic layer exhibits a thickness between 10 and 100 micrometers.

12. A method for manufacturing an opto-electric device, comprising the steps of:
   providing an opto-electric element and/or layer,
   providing an encapsulation comprising a multi layer barrier stack produced according to the method of claim 10.

13. A multi layer barrier stack or opto-electric device, obtained by a method according to claim 10.

14. A photocurable resin composition according to claim 1, wherein component A comprises dehydrated CaO.

15. A photocurable resin composition according to claim 1, wherein at least two (meth)acrylate functionalities are exhibited by component (F).

16. A photocurable resin composition according to claim 1, wherein component (F) exhibits a ClogP higher than 2.

17. The photocurable resin composition according to claim 14, wherein said dehydrated CaO have a calcium hydroxide content of less than 5% by weight and a calcium carbonate content of less than 1% by weight.

* * * * *